(12) United States Patent
Hosomi et al.

(10) Patent No.: US 7,531,751 B2
(45) Date of Patent: May 12, 2009

(54) METHOD AND SYSTEM FOR AN IMPROVED PACKAGE SUBSTRATE FOR USE WITH A SEMICONDUCTOR PACKAGE

(75) Inventors: Eiichi Hosomi, Austin, TX (US); Yuichi Goto, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 11/114,362

(22) Filed: Apr. 26, 2005

(65) Prior Publication Data

US 2006/0237222 A1 Oct. 26, 2006

(51) Int. Cl.
*H05K 1/00* (2006.01)
(52) U.S. Cl. .................... 174/250; 174/255; 333/33
(58) Field of Classification Search ........ 361/174, 361/749–754; 174/254–258, 250; 333/33
See application file for complete search history.

(56) References Cited

U.S. PATENT DOCUMENTS

| | | | |
|---|---|---|---|
| 4,353,040 A | 10/1982 | Krumm et al. | |
| 6,392,160 B1 * | 5/2002 | Andry et al. | 174/261 |
| 6,700,076 B2 * | 3/2004 | Sun et al. | 174/262 |
| 6,850,133 B2 * | 2/2005 | Ma | 335/78 |
| 6,937,480 B2 * | 8/2005 | Iguchi et al. | 361/780 |
| 6,972,650 B2 * | 12/2005 | Ma | 335/78 |

FOREIGN PATENT DOCUMENTS

| | | |
|---|---|---|
| JP | 09-018097 | 1/1997 |
| JP | 2004-140325 | 5/2004 |

* cited by examiner

*Primary Examiner*—Jeremy C. Norris
*Assistant Examiner*—Abiy Getachew
(74) *Attorney, Agent, or Firm*—Sprinkle IP Law Group

(57) ABSTRACT

Systems and methods for a structure for a package substrate for use in a semiconductor package are disclosed. Package substrates formed according to the systems and methods of the present invention may exhibit improved signal integrity and quality. In order to achieve this increase signal integrity, these systems and methods may endeavor to obtain equalization, or matching, of impedances in signal traces in or on the package substrate by removing material from one or more layers of a package substrate in a region of high signal density. Removing material from these layers may serve to increase the impedance of a signal trace within a region of high signal density such that the impedance of the signal trace with the region of high signal density is substantially matched to the impedance of the signal trace outside the region of high-signal density.

13 Claims, 6 Drawing Sheets

METHOD AND SYSTEM FOR AN IMPROVED PACKAGE SUBSTRATE FOR USE WITH A SEMICONDUCTOR PACKAGE

TECHNICAL FIELD OF THE INVENTION

The invention relates in general to signal traces in semiconductor packages, and more particularly, to methods and systems for semiconductor packages with improved impedance matching of signal traces in the semiconductor package.

BACKGROUND OF THE INVENTION

With the advent of the computer age, electronic systems have become a staple of modern life, and some may even deem them a necessity. Part and parcel with this spread of technology comes an ever greater drive for more functionality from these electronic systems. A microcosm of this quest for increased functionality is the size and capacity of various semiconductor devices. From the 8 bit microprocessor of the original Apple I, through the 16 bit processors of the original IBM PC AT, to the current day, the processing power of semiconductors has grown while the size of these semiconductors has consistently been reduce. In fact, Moore's law recites that the number of transistors on a given size piece of silicon will double every 18 months.

As semiconductors have evolved into these complex systems utilized in powerful computing architectures, almost universally, the connectivity and power requirements for these semiconductors have been increasing. These increased connectivity requirements have meant that the number of pins on semiconductors is steadily increasing as well. These high pin counts have ramifications on the semiconductor packages used in conjunction with these semiconductors.

One type of semiconductor package utilized in conjunction with a semiconductor is a wire bonding type package. In this type of semiconductor package, it is usually the case that bonding pads on the semiconductor die can be arranged only along the edges of the die. Therefore, in a wire bonding type package the maximum pin count of a semiconductor device may be restricted by the size of the die of the semiconductor.

Another type of semiconductor package, which may be more suitable for high pin count devices, is a flip chip package. Turning briefly to FIG. 1, one embodiment of a flip chip semiconductor package is depicted. Die 110 containing a semiconductor, such as a microprocessor, is attached to substrate 120. Die 110 may have an array of bonding pads coupled to a corresponding array of C4 pads on substrate 120. Each of these C4 pads may be coupled to a ball grid array (BGA) bonding pad on substrate 120 through a signal trace. These BGA bonding pads are in turn coupled to substrate BGA balls 130 which serve to couple die 110 to a power source or signal input/output lines. Typically substrate 120, with which microprocessors or semiconductors are packaged, is made of organic material (such as epoxy resin) and may be fabricated using build-up technology, which enables higher wiring capability by having fine-line build-up layer(s) on both sides of a coarser core substrate. As bonding pads may be arranged in an array on die 110, flip chip package 100 may be more suitable for use with a semiconductor having a high pin count.

In main, there are two ways to achieve signaling in a semiconductor package, single ended signaling and differential signaling. In single ended signaling a single trace may be used in conjunction with a positive voltage and a reference voltage (usually ground). As the reference voltage may vary over distance differential signaling may be a superior methodology for some applications. Differential signaling uses two signal traces for each signal for immunity to noise and crosstalk. In differential signaling a signal is sent down one wire as positive and the other as negative, and the circuit at the receiving end derives the signal from the difference between the two.

Turning to FIG. 2, one embodiment of signal routing on a portion of a package substrate of a semiconductor package which employs differential signaling is illustrated. C4 pads 210 on substrate 200 are connected to one BGA pad 220 using signal traces 212. Each pair 214 of signal traces 212 is utilized to carry one signal to or from C4 pads 210 which are coupled to a semiconductor die (not shown). This semiconductor can then derive the signal from the difference between the pair of signal traces 214.

No matter the type of signaling used in a semiconductor package, however, it is important to signal integrity that impedance is substantially matched in an entire signal trace. This may be especially true in the case of high-speed signals. The impedance of a signal trace is, however, affected by the density of the signal traces in a package. More specifically, a coupling effect between adjacent signal traces in close proximity to one another may serve to decrease the impedance of a signal trace. As C4 bumps for the coupling of a semiconductor die are usually much closer to one another than the BGA pads on a substrate, crowding of signal traces frequently occurs in semiconductor packages in a region proximal to the C4 pads.

Referring again to FIG. 2, suppose each signal trace has an impedance of 100 ohms and that in high signal density region 240, proximal to C4 pads 210, the distance between each signal trace 212 in a pair of signal traces 214 may be substantially equal to the distance between adjacent signal trace pairs 214. Usually in high signal density region 240 the distance between adjacent signal pairs 214 is less than 200 microns. This may lead to a decrease of around 3 ohms in the impedance of signal traces 212 in region 240.

Typically, to solve this problem use narrower trace widths in a high signal density region. This solution, however, increases the cost of manufacturing the package substrate of a semiconductor package while simultaneously reducing the manufacturing yields of this substrate. Additionally, the impedance tolerance may increase with these narrower trace widths.

Another solution to this problem is to use a thicker dielectric material to form the substrate in the high signal density region and wider trace width in the area outside of the high signal density region. This solution may make it more difficult to form vias in the substrate, and may be an additional obstacle to fine pitch substrate.

Yet another solution to this problem is to increase the number of routing layers in the package substrate. This solution, however, may be prohibitively expensive to implement.

Thus, a need exists for a semiconductor package with improved impedance matching in signal traces within the semiconductor package.

SUMMARY OF THE INVENTION

Systems and methods for a structure for a package substrate for use in a semiconductor package are disclosed. Package substrates formed according to the systems and methods of the present invention may exhibit improved signal integrity and quality. In order to achieve this increase signal integrity, these systems and methods may endeavor to obtain equalization, or matching, of impedances in signal traces in or on the package substrate by removing material from one or more layers of a package substrate in a region of high signal density. Removing material from these layers may serve to increase the impedance of a signal trace within a region of high signal density such that the impedance of the signal trace with the region of high signal density is substantially matched to the impedance of the signal trace outside the region of high-signal density.

In one embodiment, a package substrate formed of a set of layers has a layer with a set of holes in a region of high signal density.

In another embodiment, the amount of material to be removed from the layer may be determined, and this amount of material removed by forming the set of holes.

In still another embodiment, these holes may be of the same shape and size, with the same distance between the holes.

In yet another embodiment, the package substrate may have another layer with holes of the same shape and size.

In addition to improving impedance matching in the length of a signal trace, embodiments of the present invention may have the technical advantage that reflection and insertion losses of these signal traces may also be reduced. Additionally, embodiments of the present invention by reduce the coupling effects of adjacent signal traces.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. Skilled artisans should understand, however, that the detailed description and the specific examples, while disclosing preferred embodiments of the invention, are given by way of illustration only and not by way of limitation. Various substitutions, modifications, additions or rearrangements within the scope of the underlying inventive concept(s) will become apparent to those skilled in the art after reading this disclosure.

Reference is now made in detail to the exemplary embodiments of the invention, examples of which are illustrated in the accompanying drawings. Wherever possible, the same reference numbers will be used throughout the drawings to refer to the same or like parts (elements).

A few terms are defined or clarified to aid in an understanding of the terms as used throughout the specification. The term "pitch" is intended to mean a distance between two features, for example holes formed in a layer of a package substrate. The term "hole" is intended to mean any area, of any shape, where material has been removed.

Figure 1:
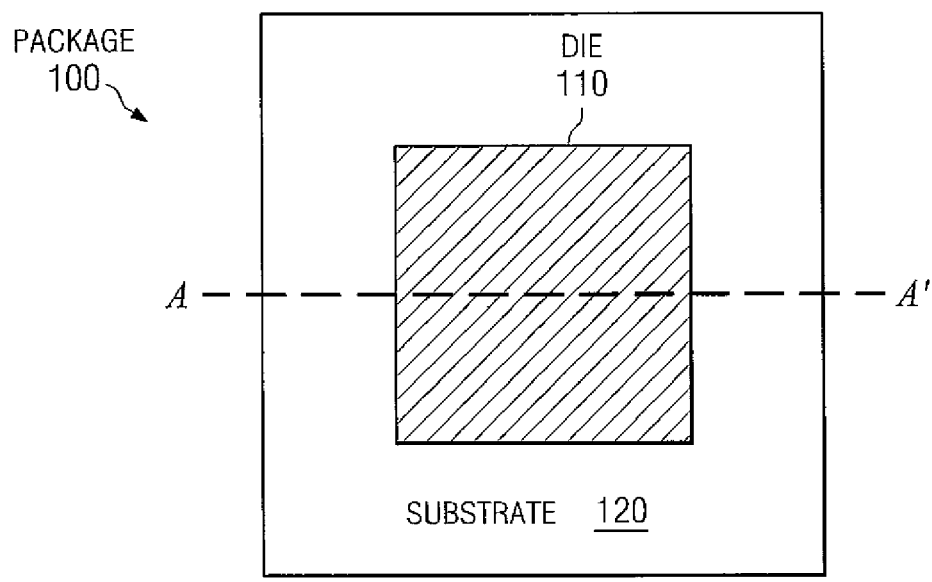
FIG. 1 depicts an illustration of a semiconductor package.
Figure 1:
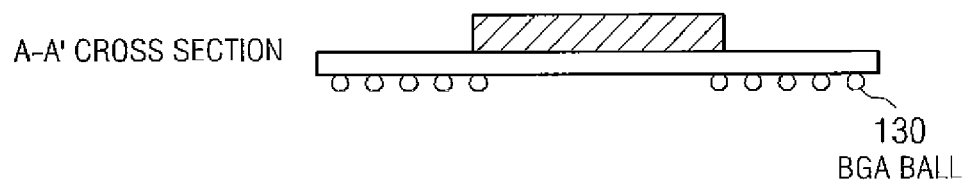
Figure 1:
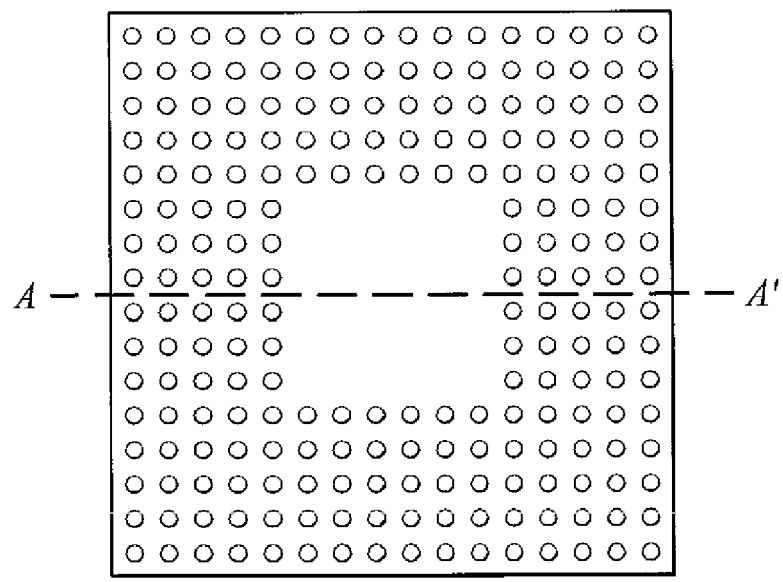
Figure 2:
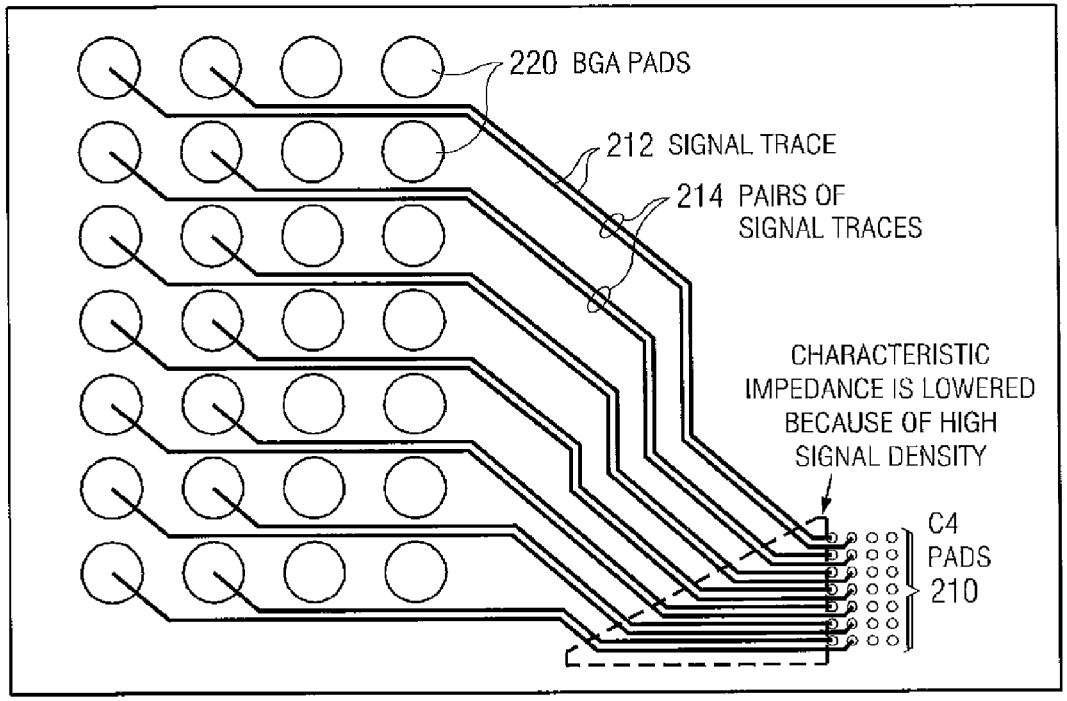
FIG. 2 depicts an overhead view of signal trace routing in a package substrate.
Figure 3:
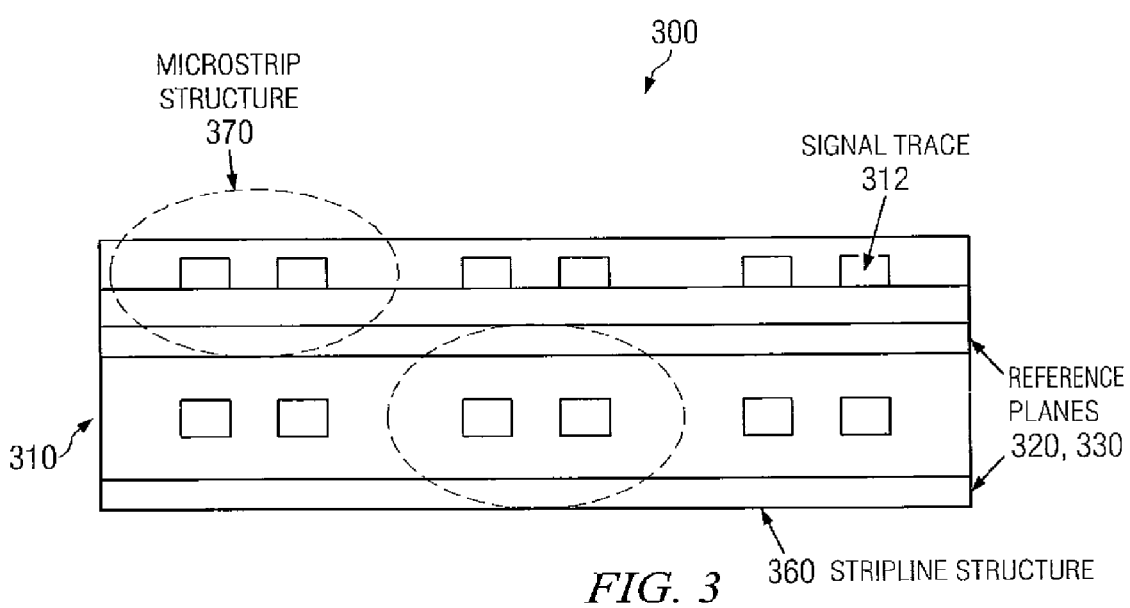
FIG. 3 depicts a cross sectional illustration of one embodiment of a package substrate.

Before turning to embodiments of the present invention, a general description of a package structure which may be utilized in explaining these various embodiments will be described. A cross-sectional view of one embodiment of a structure for a package substrate is depicted in FIG. 3. Package substrate 300 may contain both stripline and microstrip structures. In stripline structure 360, one signal conductor layer 310 is sandwiched between two reference plane layers 320, 330, one reference plane layer 320 on top and one reference plane layer 330 on the bottom. Signal traces 312 are routed through signal conductor layer 310. Stripline structure 360 can provide a good return current path for high-speed signals, reduce crosstalk and noise coupling, while low-dielectric-constant substrate material enables good signal coupling. In stripline structure 360, multiple plane and split configurations may be available for many different I/O voltage potentials. In addition to providing good impedance control, the multi-layer substrate construction in a stripline structure 360 may make differential routing schemes and skews easier to manage.

Microstrip structure 370 is a transmission line configuration comprising signal traces 312 in a conductor over reference plane layer 320, where the conductor and the reference plane layer 320 are separated by dielectric material. The benefits of microstrip structure 370 may include controlled signal impedance, reduced signal crosstalk, and reduced signal inductance.

Attention is now directed to systems and methods for a structure for a package substrate for use in a semiconductor package. Package substrates formed according to the systems and methods of the present invention may exhibit improved signal integrity and quality. In order to achieve this increase signal integrity, these systems and methods may endeavor to obtain equalization, or matching, of impedances in signal traces in or on the package substrate. Embodiments of this invention may achieve this impedance matching by removing material from one or more layers of a package substrate in a region of high signal density to form holes in the layer. Removing material from these layers may serve to increase the impedance of a signal trace within a region of high signal density such that the impedance of the signal trace with the region of high signal density is substantially matched to the impedance of the signal trace outside the region of high-signal density. Removing material from these layers may also serve to increase signal integrity within the signal trace by minimizing reflection and insertion loss of these signal traces.

Embodiments of the present invention may use a simulation to determine an amount material to remove from a layer of a package substrate. Referring to FIG. 3, as reference plane layers 320, 330 may act as a return path for current flowing though signal traces 312, removing material from reference plane layer 320 or 330 may affect the impedance of signal traces 312. In one embodiment a simulation may determine an amount material to remove from reference plane layer 320 in order to match the average impedance of signal traces 312 in microstrip structure 370 in a high signal density region to the average impedance of signal traces 312 in microstrip structure 370 outside of the high signal density region. After this, the simulation may then determine if an amount of material needs to be removed from reference plane layer 330 to match the average impedance of signal traces 312 in stripline structure 360 in a high signal density region to the average impedance of signal traces 312 in stripline structure 360 outside of the high signal density region, and if so the simulation may determine this amount. A package substrate can then be formed with substantially the amount of material removed from reference layers 320, 330 as was determined by the simulation. To determine the amount of material to be removed from reference layers 320, 330, the simulation may take into account factors such as the type of signaling to be used in the semiconductor package, the impedance of the signal traces, distance between the signal traces or pairs of signal traces, the speed of the signal, where the material is to be removed, how the material is to be removed from reference layers 320, 330 etc.

The simulation may also take account of the manufacturing processes by which a particular semiconductor package may be formed. In order to optimize the formation of reference plane layers 320, 330 for a particular manufacturing process, the simulation may determine the amount of material to be removed from reference plane layers 320, 330 and/or how material is to be removed from reference plane layers 320, 330, based on the manufacturing processes which will be utilized to form the package substrate. For example, the simulation may determine that material is to be removed from reference plane layers 320 and/or 330 by forming holes of various shapes in the reference plane layers in an area of high signal density, such that the holes taken in aggregate remove substantially the amount of material determined by the simulation.

Figure 4A:
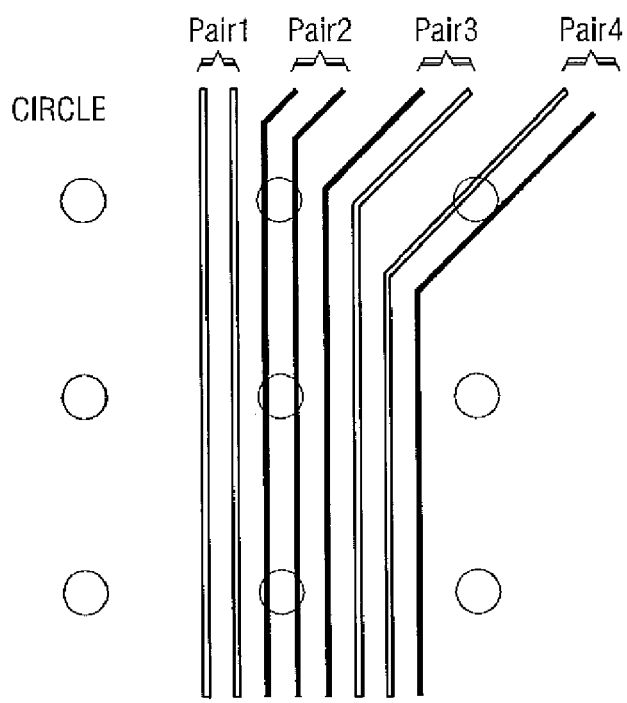
FIG. 4A depicts one embodiment of the present invention where material has been removed from a reference plane layer by forming a set of circular holes in a reference plane layer in a region of high signal density.
Figure 4B:
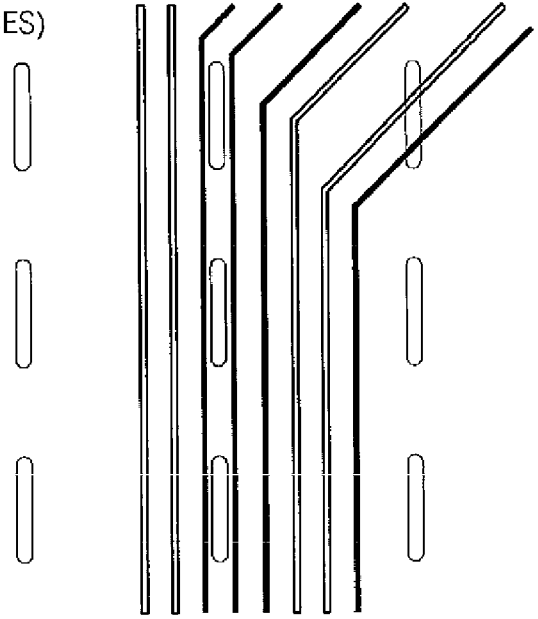
FIG. 4B depicts one embodiment of the present invention where material has been removed from a reference plane layer by forming a set of substantially identical ellipses with fixed spacing between them in a reference plane layer in a region of high signal density.
Figure 4C:
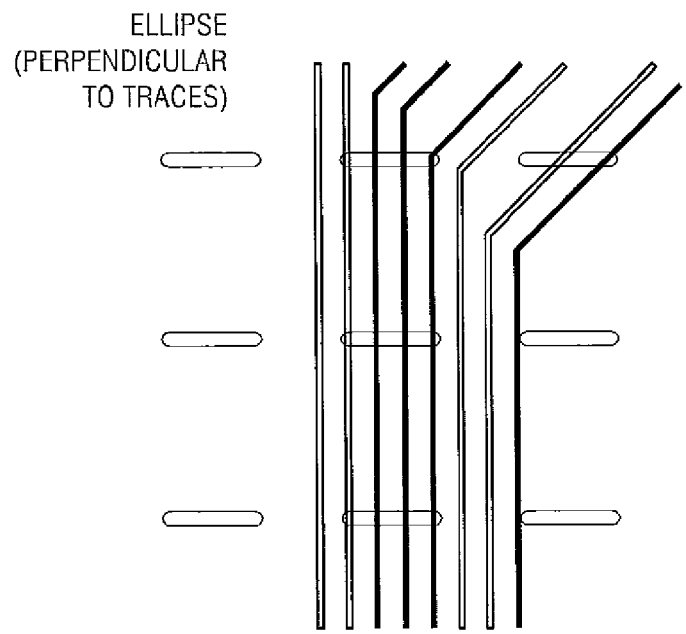
FIG. 4C depicts one embodiment of the present invention where material has been removed from a reference plane layer by forming a set of substantially identical ellipses with fixed spacing in a reference plane layer in a region of high signal density.

FIGS. 4A, 4B and 4C depict various embodiments according to the present invention of differently shaped holes formed in a reference plane layer. As can be seen, FIG. 4A depicts one embodiment of the present invention where material has been removed from a reference plane layer by forming a set of circular holes of like diameter and pitch in a reference plane layer in a region of high signal density. FIG. 4B depicts one embodiment of the present invention where material has been removed from a reference plane layer by forming a set of substantially identical ellipses with fixed spacing between them in a reference plane layer in a region of high signal density, where each of the set of ellipses is oriented substantially parallel to the signal traces in the region of high signal density. FIG. 4C depicts one embodiment of the present invention where material has been removed from a reference plane layer by forming a set of substantially identical ellipses with fixed spacing in a reference plane layer in a region of high signal density where each of the set of ellipses is oriented substantially perpendicular to the signal traces in the region of high signal density.

Figure 5:
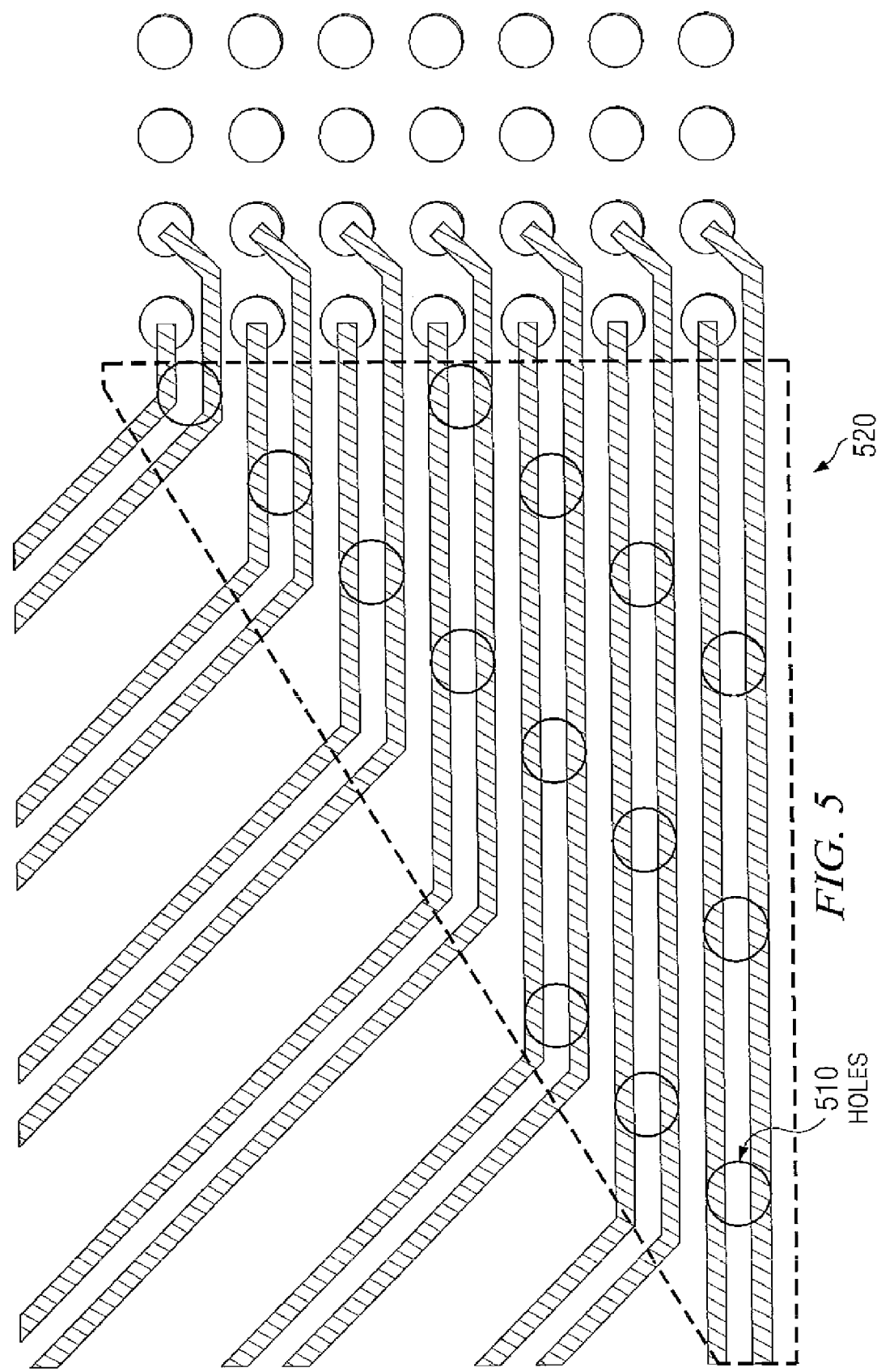
FIG. 5 depicts a representation of one embodiment of the present invention.

Turning now to FIG. 5, an overhead view of a portion of a package substrate according to one specific embodiment of the present invention is depicted. Holes 510 are formed in one or more layers of package substrate 500 in region 520 of high signal density. Referring briefly to FIG. 3, in one embodiment, holes 510 may exist in reference plane layer 320 to effect signal traces 312 in microstrip structure 360. In another embodiment, holes 510 may exist in reference plane layer 320 or reference plane layer 330 to affect signal traces 312 in stripline structure 370.

Returning again to FIG. 5, as mentioned above, holes 510 affect the impedance of signal traces 512 over or under which they are formed. In one embodiment, by forming circular holes 510 of a fixed diameter and at a fixed pitch (distance between center of holes 510) in high density signal region 520 the average impedance of signal traces 512 in high signal density region 520 can be matched to the average impedance of signal traces 512 outside of high density signal density region 520. The diameter and pitch of holes 510 in high density signal region 520 may be determined by empirical means or by simulation based factors such as the type of signaling to be used in the semiconductor package, the impedance of the signal traces, distance between the signal traces or pairs of signal traces, the speed of the signal, where the holes 510 are to be formed etc. Referring specifically to the embodiment depicted in FIG. 5, if differential signaling is used in substrate 500, where the differential impedance between signal traces 512 in a pair of signal traces 514 is about 100 ohms while the signal speed is to be around 500 mhz, the diameter of holes 510 formed may be approximately 200 microns, while the pitch of holes 510 may be approximately 630 microns.

Figure 6:
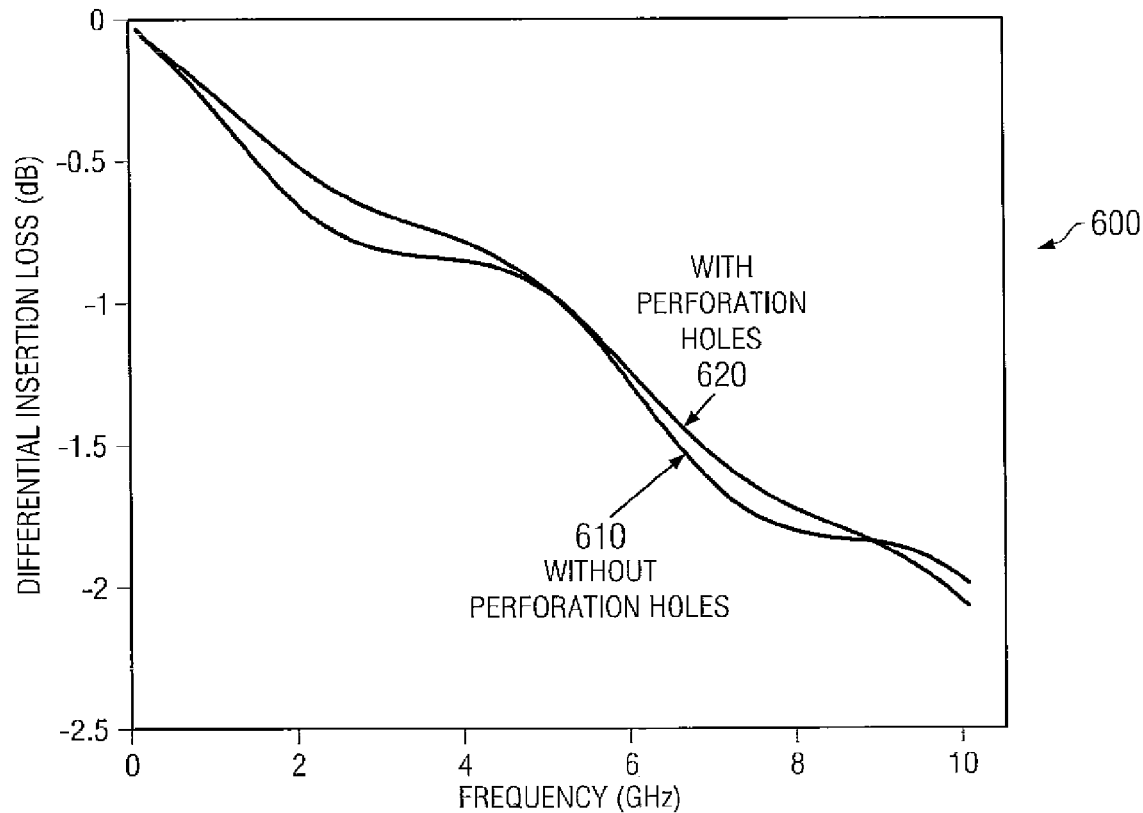
FIG. 6 depicts the improvement in insertion loss which may be achieved by embodiments of the present invention.

FIG. 6 illustrates the improvement in insertion loss gleaned by the embodiment of the present invention depicted in FIG. 5. In particular, in graph 600 plot 610 represents the insertion loss in a signal trace in a substrate where the differential impedance between signal traces in a pair of signal traces is about 100 ohms, while plot 620 represents the insertion loss of a signal trace in the same type of substrate with holes formed where the diameter of holes is approximately 200 microns, while the pitch of holes is approximately 630 microns. Notice that at the frequency range between 2 GHz and 3 GHz, the frequency at which some input and output signals may operate, there is approximately a 0.2 db difference in insertion loss between the substrate with holes and the substrate without holes.

Figure 7:
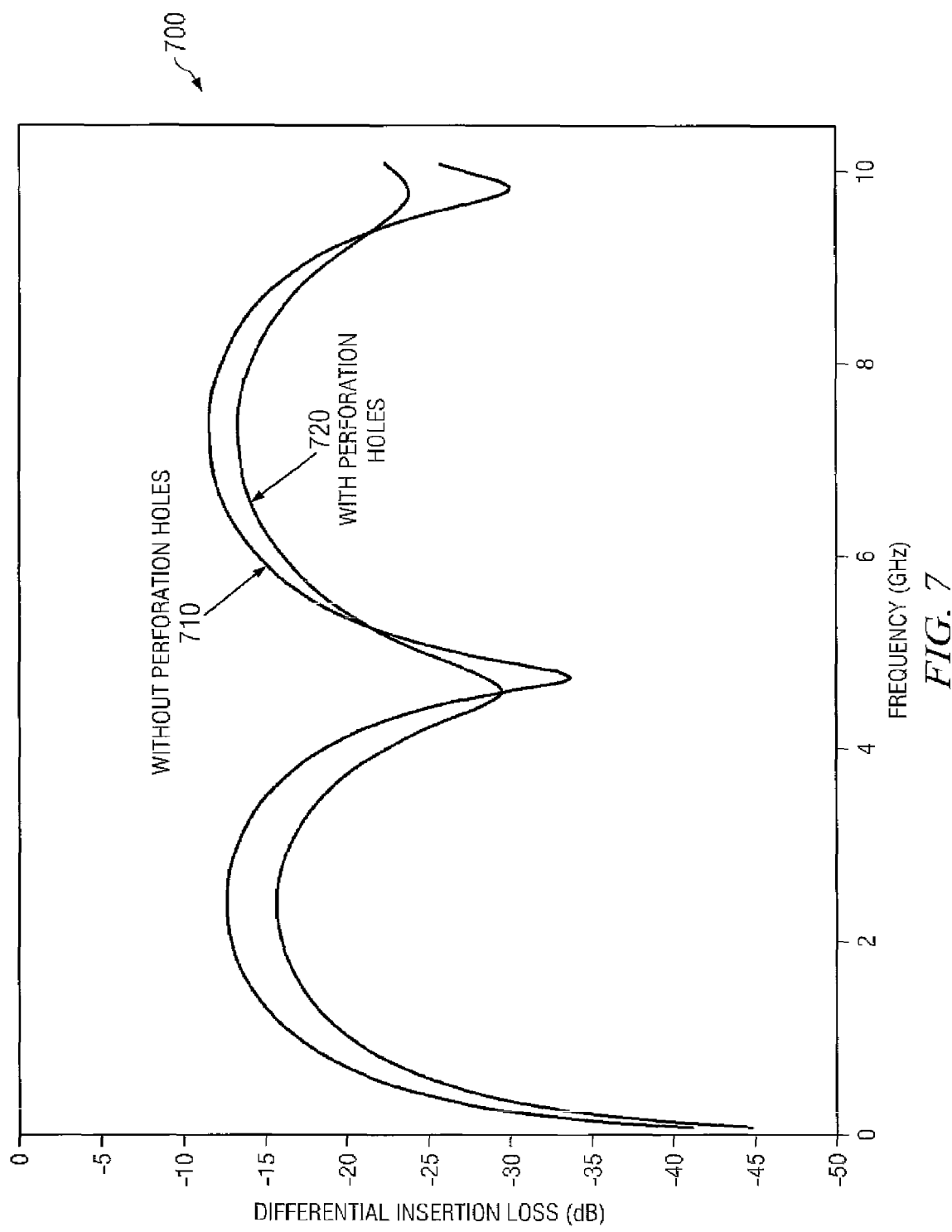
FIG. 7 depicts the improvement in reflection loss which may be achieved by embodiments of the present invention.

A similar improvement can be seen in the reflection loss of a substrate, as depicted in FIG. 7. FIG. 7 illustrates the improvement in reflection loss gleaned by the embodiment of the present invention depicted in FIG. 5. In particular, in graph 700 plot 710 represents the reflection loss in a signal trace in a substrate where the differential impedance between signal traces in a pair of signal traces is about 100 ohms while plot 720 represents the reflection loss of a signal trace in the same type of substrate with holes formed where the diameter of holes is approximately 200 microns, while the pitch of holes is approximately 630 microns. Notice the large improvements in reflection loss in the frequency range between 2 GHz and 4 GHz.

It will be apparent to those of skill in the art after reading this disclosure that traditional manufacturing processes may be utilized to achieve the power distribution network disclosed herein. Including using masks, photomasks, x-ray masks, mechanical masks, oxidation masks, lithography etc to form the structures described with respect to the systems and methods of the present invention.

Furthermore, embodiments of the systems and methods presented may be utilized to improve the quality and integrity of signals in a semiconductor package no matter the type of semiconductor package, package substrate or signaling used. For example, though the systems and methods of the present invention were described with respect to differential signaling they may be applied equally as effectively to a package substrate in which single ended signaling is to be used. Additionally, though the systems and methods of the present invention were described with respect to a package substrate with both microstrip and stripline structures, these systems and methods may be applied just as easily to a package substrate with only one of those structures, or other type of structures.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. A package substrate for use with a semiconductor package, comprising:
   a first reference plane layer which consists of a conductive material and has a first set of holes, the first set of holes being a void; and
   a first signal layer which is stacked on the first reference plane layer and has first and second signal traces,
   wherein at least one of the first holes is provided direct under or upper both of the first and second signal traces, and the first and second signal traces are separated from the first reference plane layer by a dielectric material.

2. The package substrate of claim 1, wherein the first signal layer comprises a microstrip structure.

3. The package substrate of claim 2, wherein the first holes are of the same shape and size, and a pitch between the first set of holes is the same.

4. The package substrate of claim 2, further comprising a second reference plane layer which consists of a conductive material and has a second set of holes, the second set of holes being a void; and
   a second signal layer which is provided between the first and second reference plane layers and has third and fourth signal traces,
   wherein the third and fourth signal traces are separated from the first and second reference plane layers by a dielectric material.

5. The package substrate of claim 4, wherein second signal layer comprises a stripline structure.

6. The package substrate of claim 4, wherein the second set of holes are the same shape and size, and a pitch between the second set of holes is the same.

7. The package substrate of claim 1, wherein the first set of holes has one of a circular shape and an elliptical shape.

8. The package substrate according to claim 4, wherein at least one of the first set of holes is overlapped with both of the third and fourth signal traces.

9. The package substrate according to claim 4, wherein at least one of the second set of holes is overlapped with both of the third and fourth signal traces.

10. The package substrate according to claim 6, wherein the second set of holes have one of a circular shape and an elliptical shape.

11. The package substrate according to claim 1, wherein the first reference plane layer is set to a ground potential.

12. The package substrate according to claim 1, wherein an area which has the first and second signal traces is the highest signal density.

13. The package substrate according to claim 12, wherein the area is adjacent to a die which is provided in the package.

* * * * *